(12) United States Patent
Mu et al.

(10) Patent No.: US 10,033,561 B2
(45) Date of Patent: *Jul. 24, 2018

(54) SELECTIVE POWER AMPLIFIER

(71) Applicant: Telefonaktiebolaget LM Ericsson (publ), Stockholm (SE)

(72) Inventors: Fenghao Mu, Hjärup (SE); Bengt Lindoff, Bjärred (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/625,477

(22) Filed: Jun. 16, 2017

(65) Prior Publication Data

US 2017/0310512 A1 Oct. 26, 2017

Related U.S. Application Data

(63) Continuation of application No. 15/184,550, filed on Jun. 16, 2016, now Pat. No. 9,713,107, which is a
(Continued)

(30) Foreign Application Priority Data

Dec. 20, 2011 (EP) .................................... 11194588

(51) Int. Cl.
*H04L 27/00* (2006.01)
*H03F 1/32* (2006.01)
(Continued)

(52) U.S. Cl.
CPC ........ *H04L 27/0008* (2013.01); *H03F 1/0211* (2013.01); *H03F 1/0227* (2013.01);
(Continued)

(58) Field of Classification Search
CPC .... H03F 1/0211; H03F 1/0227; H03F 1/0283; H03F 1/30; H03F 1/303; H03F 1/305;
(Continued)

(56) References Cited

U.S. PATENT DOCUMENTS 5,060,294 A 10/1991 Schwent et al.
6,091,966 A 7/2000 Meadows
(Continued)

FOREIGN PATENT DOCUMENTS

CN 1930784 A 3/2007
CN 101167256 A 4/2008
(Continued)

OTHER PUBLICATIONS

3GPP, "3rd Generation Partnership Project; Technical Specification Group Radio Access Network; Evolved Universal Terrestrial Radio Access (E-UTRA); User Equipment (UE) radio transmission and reception (Release 11)", 3GPP TS 36.101 V11.2.0 (Sep. 2012), Sep. 2012, 1-359.
(Continued)

*Primary Examiner* — Young T Tse
(74) *Attorney, Agent, or Firm* — Murphy, Bilak & Homiller, PLLC

(57) ABSTRACT

A transmitter comprising a power amplifier, a phase modulator, a switched DC-DC converter, all operating in dual mode, and a controller is disclosed. The power amplifier is arranged to selectively operate either in a first mode or in a second mode, wherein the first mode is a linear mode and the second mode is a non-linear mode in order to save power with least increasing cost in hardware. The transmitter is adapted to operate at different allocated bandwidths, for different radio standards while keeping minimum power
(Continued)

consumption governed by the controller. A transceiver, a communication device, a method and a computer program are also disclosed.

5 Claims, 9 Drawing Sheets

Related U.S. Application Data continuation of application No. 14/366,542, filed as application No. PCT/SE2012/051345 on Dec. 5, 2012, now Pat. No. 9,392,560.

(60) Provisional application No. 61/582,541, filed on Jan. 3, 2012.

(51) Int. Cl.
| | |
|---|---|
| *H03F 3/19* | (2006.01) |
| *H03F 3/24* | (2006.01) |
| *H04W 52/02* | (2009.01) |
| *H03F 1/02* | (2006.01) |
| *H03F 3/217* | (2006.01) |

(52) U.S. Cl.
CPC ............ *H03F 1/3282* (2013.01); *H03F 3/19* (2013.01); *H03F 3/217* (2013.01); *H03F 3/245* (2013.01); *H04W 52/0209* (2013.01); H03F 2200/102 (2013.01); H03F 2200/336 (2013.01); H03F 2200/451 (2013.01); *H03F 2201/3212* (2013.01)

(58) Field of Classification Search
CPC ........ H03F 1/32; H03F 1/3241; H03F 1/3282; H03F 1/42; H03F 3/189; H03F 3/19; H03F 3/20; H03F 3/217; H03F 3/2178; H03F 3/24; H03F 3/245; H03F 3/34; H03F 3/343; H03F 3/38; H03F 3/43; H03F 2200/102; H03F 2200/111; H03F 2200/324; H03F 2200/327; H03F 2200/336; H03F 2200/351; H03F 2200/451; H03F 2201/32; H03F 2201/3212; H04L 27/0008; H04L 27/0018; H04W 52/0209
USPC ..... 375/295–297, 300, 308; 330/124 R, 125, 330/126, 124 D, 127, 135, 136; 381/94.1, 381/94.2, 94.3, 94.5; 455/501, 572, 455/114.2, 114.3
See application file for complete search history.

(56) References Cited

U.S. PATENT DOCUMENTS

| | | | |
|---|---|---|---|
| 6,748,021 B1 | 6/2004 | Daly | |
| 7,679,433 B1 | 3/2010 | Li | |
| 2004/0266366 A1 | 12/2004 | Robinson et al. | |
| 2006/0202774 A1* | 9/2006 | Hirano | H03C 3/0925 332/144 |
| 2008/0242246 A1 | 10/2008 | Minnis et al. | |
| 2009/0004981 A1 | 1/2009 | Eliezer et al. | |
| 2009/0289717 A1* | 11/2009 | Tanaka | H03F 1/0261 330/277 |
| 2010/0056068 A1 | 3/2010 | Takinami et al. | |
| 2010/0136928 A1* | 6/2010 | Rofougaran | H04W 52/0245 455/90.2 |
| 2011/0050348 A1* | 3/2011 | Makioka | H03F 1/32 330/295 |
| 2011/0070848 A1* | 3/2011 | Ramachandra Reddy | H03F 1/0227 455/127.2 |
| 2011/0156812 A1* | 6/2011 | Parkhurst | H03F 1/0277 330/124 R |
| 2012/0114075 A1* | 5/2012 | Shimada | H03F 1/0227 375/298 |
| 2013/0059554 A1 | 3/2013 | Ripley et al. | |

FOREIGN PATENT DOCUMENTS

| | | |
|---|---|---|
| CN | 100586031 C | 1/2010 |
| EP | 1492229 A1 | 12/2004 |
| EP | 1710918 A1 | 10/2006 |
| EP | 2200183 A2 | 6/2010 |
| RU | 2119714 C1 | 9/1998 |
| RU | 2305896 C2 | 9/2007 |
| WO | 03088511 A1 | 10/2003 |
| WO | 2010108044 A1 | 9/2010 |
| WO | 2011050033 A1 | 4/2011 |
| WO | 2012/020363 A1 * | 2/2012 |

OTHER PUBLICATIONS

3GPP, "3rd Generation Partnership Project; Technical Specification Group Radio Access Network; User Equipment (UE) radio transmission and reception (FDD) (Release 10)", 3GPP TS 25.101 V10.7.0 (Sep. 2012), Sep. 2012, 1-282.
Fuh, Hanching et al., "Multi-Mode Power Amplifiers for 3G Wireless Networks", BWRC Retreat. Jun. 2-4, 2002. pp. 1-10.
Huang, Jiwei et al., "A Dual Mode GaAs HBT Power Amplifier for LTE Applications", 2010 10th IEEE International Conference on Solid-State and Integrated Circuit Technology (ICSICT). Nov. 1-4, 2010. pp. 722-724. Shanghai, China.
Stauth, Jason T. et al., "Energy Efficient Wireless Transmitters: Polar and Direct-Digital Modulation Architectures", EECS Department; University of California, Berkeley; Technical Report No. UCB/EECS-2009-22. Feb. 4, 2009. pp. 1-199.

* cited by examiner

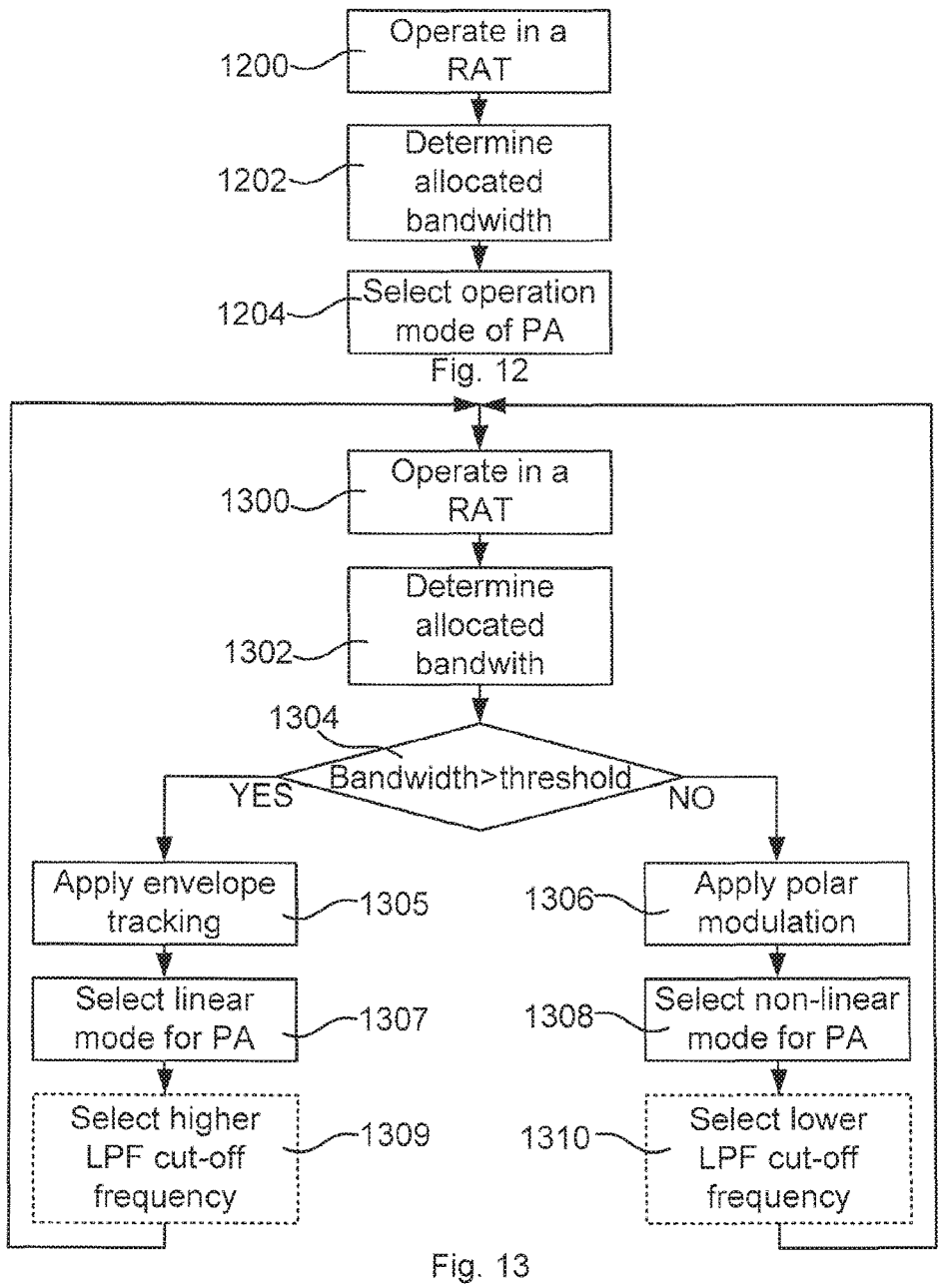
Fig. 12
Fig. 13
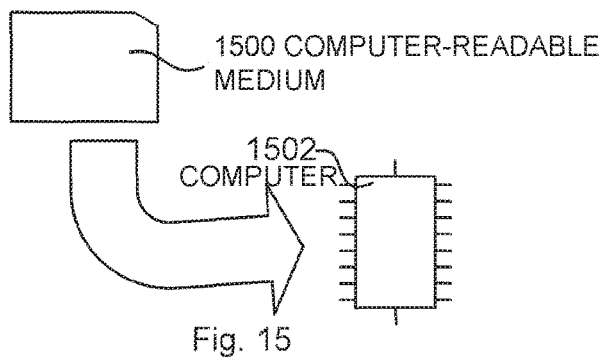
Fig. 15

SELECTIVE POWER AMPLIFIER

RELATED APPLICATIONS

This application is a continuation of a U.S. patent application Ser. No. 15/184,550, filed 16 Jun. 2016, now U.S. Pat. No. 9,713,107 B2, which is a continuation of U.S. patent application Ser. No. 14/366,542, filed 18 Jun. 2014, now U.S. Pat. No. 9,392,560 B2, which is a national stage entry under 35 U.S.C. § 371 of international patent application serial no PCT/SE2012/051345, filed 5 Dec. 2012, which claims priority to and the benefit of U.S. provisional patent application Ser. No. 61/582,541, filed 3 Jan. 2012, as well as to EP application 11194588.7, filed 20 Dec. 2011. The entire contents of each of the aforementioned applications are incorporated herein by reference.

TECHNICAL FIELD

The present invention generally relates to a transmitter arranged to operate in different modes depending on allocated bandwidth of transmission, and to a corresponding transceiver, communication device, method and computer program.

BACKGROUND

Reduction of energy consumption in radio devices is always desired, and particularly for radio devices that rely on battery. Most energy is consumed when transmitting, and a power amplifier, having its task to provide the radio power to antenna, will of course consume some amount of energy. However, not all energy provided as supply power to the power amplifier becomes signal power for the radio signal. Thus, the power amplifier and the transmitter have a degree of power efficiency, i.e. signal power in relation to supply power. It is therefore a desire to provide a radio, and a way to operate it, which provide good efficiency.

SUMMARY

An object of the invention is to at least alleviate the above stated problem. The present invention is based on the understanding that, when using a radio in communication systems allowing a multitude of transmission scenarios in sense of allowed or devised transmission properties, depending on transmission properties, and especially allocated bandwidth, the most efficient, and still feasible with regard to side effects, among polar modulation operation and envelope tracking operation of a power amplifier and closely related circuitry of the transmitter can be selected such that quality of operation is improved in sense of low energy consumption and low impact of non-desired side effects. That is, polar modulation is preferred to be used due to its relatively low energy consumption as long as side effects, such as spectral leakage, is within reasonable limits, and by this idea, the envelope tracking is used otherwise to maintain proper transmission. The power amplifier can thus be operated in non-linear, and thus energy saving, mode as much as possible, and then be operated in linear, but more energy consuming, mode when that is necessary. The allocated bandwidth is the most important factor for deciding when to use which mode, but this disclosure also provides approaches for further adaptation to the circumstances, such as considering modulation type, output power, error vector magnitude and/or spectral leakage requirement for the transmission to be made by the transmitter, wherein energy consumption can be held down when any possibility for that is given by the transmission properties.

According to a first aspect, there is provided a transmitter comprising a power amplifier; a switch mode voltage converter of direct current-to-direct current type arranged to provide power supply to the power amplifier; and a controller. The power amplifier is arranged to selectively operate in a first mode or in a second mode, wherein the first mode is a linear mode and the second mode is a non-linear mode. The controller is arranged to, when operating in a radio access technology, RAT, allowing different allocated bandwidths to be utilised, determine allocated signal bandwidth for a transmission to be made by the transmitter in the RAT, and the controller comprises a control mechanism arranged to control the power amplifier to select one of the transmission modes for the transmission based on the determination.

In the second mode, the power amplifier may be adapted to polar modulation operation, and the switch mode voltage converter may be arranged to modulate supply voltage to the power amplifier by an amplitude component of the transmission when in the second mode.

The control mechanism may comprise a look-up table comprising bandwidth mapped on operation mode such that operation mode is selected accordingly.

The control mechanism may comprise a bandwidth threshold such that the first mode is selected if the threshold is exceeded and the second mode is selected otherwise.

The controller may be arranged to select mode such that a requirement on any of output power, error vector magnitude and spectral leakage requirement for the transmission to be made by the transmitter set by a specification for the RAT is met.

The first mode may comprise envelope tracking, and wherein the switch mode voltage converter is arranged to provide a supply voltage corresponding to the output voltage of the power amplifier with a headroom when in the first mode.

The switch mode voltage converter may further comprise an additional switch arrangement connected at the output of the switch mode voltage converter and an additional comparator connected to compare the output of the switch mode voltage converter with a determined envelope level and arranged to control the additional switch arrangement, wherein the additional switch arrangement and the additional comparator are enabled when in the first mode and envelope tracking is used.

The transmitter may further comprise a low-pass filter which is connected between an output of the switch mode voltage converter and a power supply input of the power amplifier, and wherein the low-pass filter is arranged to have a selectable first and second cut-off frequencies, wherein the second cut-off frequency is lower than the first cut-off frequency, and the low-pass filter is arranged to apply the first cut-off frequency when in the first mode, and the second cut-off frequency when in the second mode.

The transmitter may further comprise a dual mode modulator arranged to provide a linear quadrature modulation when in the first mode, and provide a phase modulation in the second mode. The dual mode modulator may comprise inputs arranged to receive quadrature baseband signals for in-phase, I, and quadrature, Q, components and radio carrier quadrature clock signals; a quadrature mixer; a transform circuit arranged to output the components I and Q unchanged in the first mode, and output, respectively, $$\frac{I}{\sqrt{I^2+Q^2}} \text{ and } \frac{Q}{\sqrt{I^2+Q^2}}$$

in the second mode, to the quadrature mixer; and a limiter (302), wherein an aggregate output of the quadrature mixer is selectably connected to an output of the dual mode modulator either via the limiter when in the second mode or directly when in the first mode.

The power amplifier, when selectively operated in the first mode or in the second mode, may be biased such that in the first mode it is arranged to operate at class A or AB, and in the second mode may be arranged to operate in class D or E.

According to a second aspect, there is provided a transceiver comprising a transmitter according to the first aspect and a receiver, wherein the transceiver is arranged to receive information about the signal transmission bandwidth for a transmission to be made by the transmitter from a remote communication node.

According to a third aspect, there is provided a communication device for wireless communication, wherein the communication device comprises a transmitter according to the first aspect or a transceiver according to the second aspect.

The communication device may be arranged to operate in a 3GPP LTE cellular communication system and the transmission is an uplink transmission, and further arranged to determine the allocated bandwidth for the uplink transmission based on allocated resource blocks indicated in a downlink transmission four subframes prior the uplink transmission.

According to a fourth aspect, there is provided a method of a transmitter comprising a power amplifier and a switch mode voltage converter arranged to provide power supply to the power amplifier. The method comprises operating the transmitter in a radio access technology, RAT, allowing different allocated bandwidths to be utilised; determining allocated signal bandwidth for a transmission to be made by the transmitter in the RAT; and selecting an operation mode of the power amplifier among a first mode or a second mode based on the determined allocated bandwidth, wherein the first mode is a linear mode and the second mode is a non-linear mode.

The second mode may include operating the power amplifier for polar modulation, and the method further comprises modulating supply voltage to the power amplifier by an amplitude component of the transmission when in the second mode.

The method may further comprise receiving information about the signal transmission bandwidth for a transmission to be made by the transmitter from a remote communication node.

The method may further comprise comparing the allocated bandwidth with a bandwidth threshold; and selecting the first mode if the threshold is exceeded, or selecting the second mode otherwise.

The method may further comprise determining a modulation to be used for the transmission to be made by the transmitter; and selecting mode also based on the modulation. The method may further comprise determining any of output power, error vector magnitude and spectral leakage requirement for the transmission to be made by the transmitter; and selecting mode such that a requirement on any of the output power, error vector magnitude and spectral leakage requirement for the transmission set by a specification for the RAT is met.

The first mode may comprise envelope tracking, and the method further comprises providing, when in the first mode, by the switch mode voltage converter, a supply voltage corresponding to the output voltage of the power amplifier with a headroom.

A low-pass filter may be connected between an output of the switch mode voltage converter and a power supply input of the power amplifier. The method may then further comprise selecting among a first and second cut-off frequencies of the low-pass filter, wherein the second cut-off frequency is lower than the first cut-off frequency, and applying the first cut-off frequency when in the first mode, and applying the second cut-off frequency when in the second mode.

The transmitter may further comprise a dual mode modulator. The method may then further comprise providing a linear quadrature modulation when in the first mode, and providing a phase modulation in the second mode, by the dual mode modulator.

The method may further comprise providing quadrature baseband signals for in-phase, I, and quadrature, Q, components and radio carrier quadrature clock signals, when in the first mode, to a quadrature mixer, or providing $$\frac{I}{\sqrt{I^2+Q^2}} \text{ and } \frac{Q}{\sqrt{I^2+Q^2}}$$

when in the second mode, to the quadrature mixer; and limiting the output of the quadrature mixer and providing the limited signal as output of the dual mode modulator when in the second mode, or providing the output of the quadrature mixer as output of the dual mode modulator when in the first mode.

The method may further comprise biasing the power amplifier to operate in class A or AB when in the first mode, or biasing the power amplifier to operate in class D or E when in the second mode.

According to a fifth aspect, there is provided a computer program comprising computer executable code which when executed on a processor causes a transmitter associated with the processor to perform the method according to the fourth aspect.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc.]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

FIG. 12 is a flow chart illustrating a method according to an embodiment.

FIG. 13 is a flow chart illustrating a method according to an embodiment.

FIG. 15 schematically illustrates a non-transitory computer readable storage medium holding a computer program arranged to be executed by a processor to implement methods according to embodiments.

DETAILED DESCRIPTION

For the understanding of this disclosure, the reader should be aware that polar modulation enables use of a nonlinear power amplifier (PA), which is power efficient, but implies bandwidth expansion issues. Using polar modulation is thus not suitable for wide bandwidth applications like wide band 3GPP LTE where bandwidths of 20 MHz can be used. A linear PA with a constant supply voltage does not imply such bandwidth expansion issues, but is significantly less power efficient than a non-linear PA. The linear PA can be made more power efficient by using envelope tracking. Envelope tracking requires use of a linear PA, which is inherently less power efficient than the non-linear PA, but is still more efficient than a PA without envelope tracking, i.e., a constant supply voltage driven PA. High power efficiency implies that more radio power is provided to the antenna and/or less heat is created by the power amplifier at a given supply power.

Figure 1:
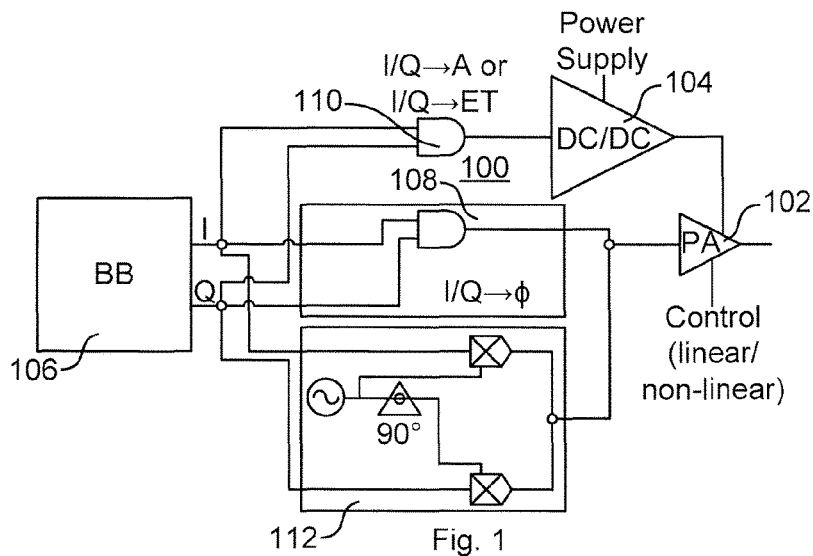
FIG. 1 illustrates a transmitter circuit according to an embodiment.

FIG. 1 illustrates a transmitter circuit 100 according to an embodiment. The transmitter circuit 100 comprises a baseband part 106 arranged to perform any baseband processing and provide an in-phase (I) and a quadrature-phase (Q) signal component to be modulated. The transmitter circuit 100 further comprises a power amplifier 102 arranged to output a modulated signal for transmission, e.g. directly to an antenna arrangement or to an antenna arrangement via an output network arranged to provide impedance matching. The transmitter circuit 100 also comprises a switch mode voltage converter 104 arranged to provide a supply voltage to the power amplifier 102. The switch mode voltage converter 104 is preferably a direct current to direct current, DC/DC, converter which in turn is connected to a power supply of any apparatus in which the transmitter circuit 100 is arranged to work.

To achieve improved efficiency for the transmitter circuit 100, the power amplifier 102 is arranged to selectively work in either linear or non-linear modes. The non-linear mode enables improved efficiency for the power amplifier, which then for example can work in class D or E. The linear mode is less efficient, but provides necessary linearity for many signal situations, e.g. to avoid spectral leakage which extends beyond desired levels, and the power amplifier can for example work in class A or AB. To benefit from this dual mode operation of the power amplifier, modulation is selectively chosen between quadrature modulation, which requires linear operation of the power amplifier, and polar modulation, which enables the power amplifier to work in non-linear mode.

In this embodiment, a polar modulator 108 transform the I and Q components into a phase component which is provided to the power amplifier. A corresponding amplitude component is provided by an amplitude generator 110 which derives the amplitude component from the I and Q components and provides the amplitude component to the switched voltage generator 104 which in turn controls the voltage supply to the power amplifier such that the amplitude component together with the phase component can be output by the power amplifier as a polar modulated signal.

Similarly, a quadrature modulator 112 modulates the I and Q components by mixing with an in-phase oscillator signal and a quadrature-phase oscillator signal, respectively, and an aggregate of the modulated I and Q components are provided to the power amplifier. The amplitude generator 110 is now used for envelope tracking and is providing, based on the I and Q components, an envelope signal to the switch mode voltage converter 104 such that it provides a suitable supply voltage to the power amplifier, wherein the power amplifier is enabled to work linearly and amplify the aggregate of the modulated I and Q components. The envelope signal tracks the envelope of the amplitude signals of the I and Q components, and provides a suitable headroom for linear operation by the power amplifier.

The transmitter circuit 100 is controlled to select the most efficient of the modes of operation based on the properties of the signal to be transmitted. This control can be provided from the baseband part 106, or from a dedicated controller (not shown). The property of the signal to be transmitted having most impact on which mode that is suitable to be used is allocated bandwidth. The decision provided by the control can be fairly simple, such as when the bandwidth is 5 MHz or below in an 3GPP LTE case, polar modulation and non-linear power amplifier operation is chosen, and above that, quadrature modulation and linear operation of the power amplifier is chosen. A more complex control can be provided where modulation properties of the I and Q components from the baseband part are considered, i.e. how signal space is used. This can be used together with the information on allocated bandwidth to for example for some configurations of the I and Q components use polar modulation and non-linear power amplifier operation also for slightly higher bandwidths, while for some other configurations of the I and Q components use quadrature modulation and linear power amplifier operation also for slightly lower bandwidths. Similar considerations for selecting mode of operation can be made based on one or more of output power, error vector magnitude and spectral leakage requirement for the transmission to be made by the transmitter. Thus, although the allocated bandwidth plays the major role in the selection, further optimisation can be made for mid-sized bandwidths based on used signal space, output power, error vector magnitude and/or spectral leakage requirement.

The selection of quadrature modulation/linear operation or polar modulation/non-linear operation can be determined according to what is demonstrated above such that spectral leakage does not extend beyond the specification of the system in which the transmitter is used, e.g. beyond what is specified in 3GPP TS25.101, 3GPP TS 36.101, or similar for the actual system.

The knowledge about the signal to be transmitted, and thus the decision about which mode of operation to select, can many times be acquired a bit in advance, which facilitates the implementation. For example, in 3GPP LTE, an uplink grant message is received four subframes in advance, which equals four ms, wherein the transmitter is aware of allocated bandwidth etc. and the adaptation of the mode can be made.

The operation of the power amplifier 102 in linear or non-linear mode can of course be achieved by selectively using either of a linear power amplifier or a non-linear power amplifier, i.e. having separate power amplifiers. However, to avoid having redundant circuitry, the control of mode of operation of the power amplifier can include adapting biasing of one power amplifier to selectively either operate in linear or in non-linear mode. An output network can also be adapted to the mode of operation of the power amplifier to take care of any unwanted harmonics.

Figure 2:
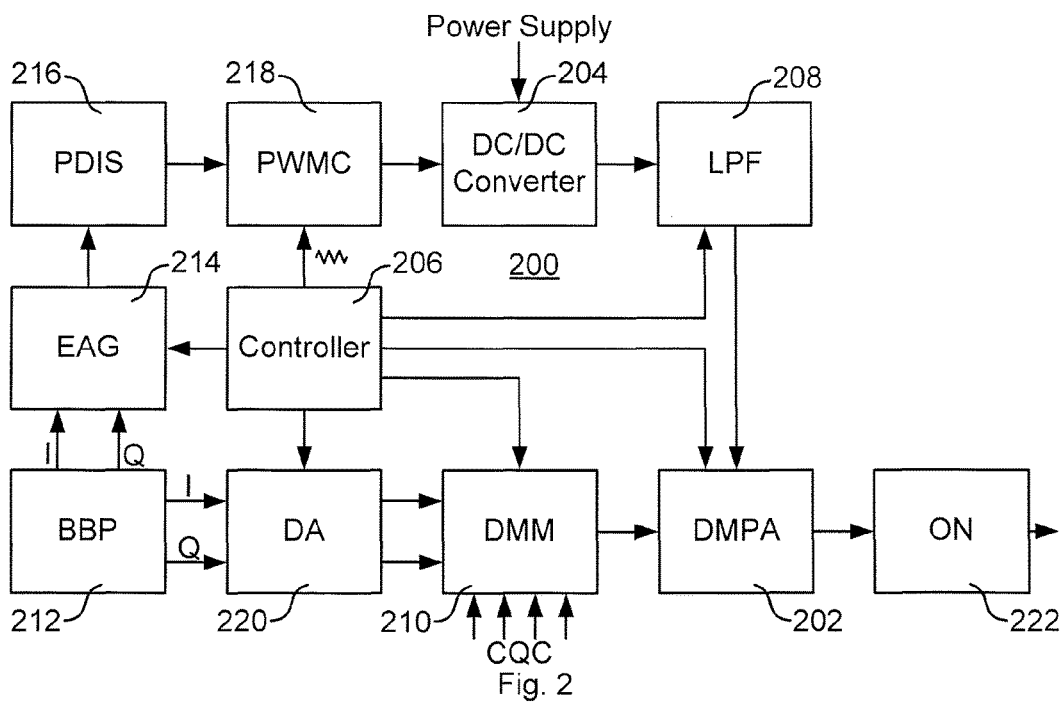
FIG. 2 schematically illustrates a transmitter circuit according to an embodiment.

FIG. 2 schematically illustrates a transmitter circuit 200 according to an embodiment. A baseband processor, BBP, 212 generates I and Q components similar to what is demonstrated with reference to FIG. 1. The I and Q components are fed into two paths, the amplitude path (upwards in FIG. 2) and the phase path (rightwards in FIG. 2). The amplitude path includes an envelope/amplitude generator, EAG, 214, a pre-distortion, PDIS, part 216, a pulse width modulation converter, PWMC, 218, a switch mode voltage converter 204, a low pass filter, LPF, 208, and a dual mode power amplifier, DMPA, 202. The phase path includes a delay adjust unit, DA, 220, a dual mode modulator, DMM, 210, and the DMPA 202 where the two paths are merged together. The DMM 210 is provided with carrier quadrature clocks, CQC, such that modulation is enabled. The CQC can comprise four signals being mutually phase shifted by 90 degrees for differential mixers, or two signals being mutually phase shifted by 90 degrees for single ended mixers.

A controller 206 is arranged to control the elements of the transmitter circuit 100 to operate according to a first operation mode, i.e. quadrature modulation and linear amplifier setting, and to a second operation mode, i.e. polar modulation and non-linear amplifier setting. The first operation mode is typically making the DMPA 202 operating in a linear mode, while the second mode sets the DMPA 202 in a non-linear operation mode. The output from the switch mode voltage converter is optionally low-pass filtered by LPF 208 prior to providing the voltage supply to the DMPA 202. Furthermore, the baseband I and Q components, generated by BBP 212, are converted to envelope or amplitude signal, depending on mode of operation, by EAG 214, and the envelope signal or amplitude signal can be pre-distorted via the PDIS 216 to reduce non-linearity in generating output signal at output of the DMPA 202. This non-linearity can include any contributions from the PWMC 218, the switch mode voltage converter 204 and the DMPA 202.

Any delay match between phase modulation path and amplitude path can be aligned by the DA 220 under control of the controller 206. The LPF 208 can have two modes, one for wide band applications, and one for narrow band applications, selected either by electrical or mechanical means. The function of the LPF 208 is to reduce ripples in the output of the switch mode voltage converter, improve adjacent channel leakage ratio for band interferences to meet spectral masks specified by radio standards, and also suppress transmitter spectral leakage into receiver band when the transmitter circuit 200 is used in a radio terminal, which implies relax of requirements for attenuation in receiver band in surface acoustic wave filters or duplexers.

After the DMPA 202, the amplified signal can pass an output network, ON, 222 which includes impedance matching that minimize the reflections and feed the majority of the signal energy to the antenna, and sometimes differential to single-ended conversion if balanced power amplifier topology is adopted. ON 222 can also be capable to reduce the unwanted frequency components created by non-linearity of the power amplifier. The ON 222 can also be controlled by the controller 206, and be adapted based on the operating mode of the power amplifier 202.

The first mode, i.e. linear mode, operation is targeted to applications using wide band, i.e. having a wide allocated bandwidth and/or having a modulation scheme using signal space for large symbols, for example a user scenario in 3GPP LTE using 20 MHz bandwidth. So in linear mode, the requirement for operating frequency or bandwidth is much high for all units, and the power efficiency drops. However, as the occupation in time normally is short and the probability for this is relatively low than operation in narrow band applications, one can bear this energy cost.

The second mode, i.e. non-linear mode, is designed to fit most narrow band applications, in multiple standards, for example, GSM, EDGE, etc., and even the narrow band user scenario in 3GPP LTE up to about 5 MHz allocated bandwidth.

Further functions, operations and options for the elements of the transmitter circuit 200 will be demonstrated with reference to FIGS. 3 to 11.

Figure 3:
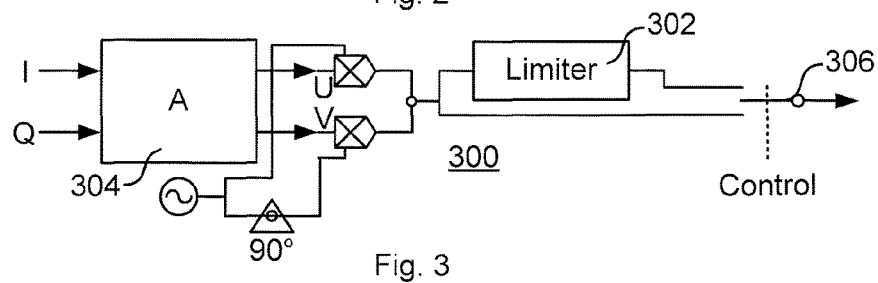
FIG. 3 schematically illustrates a dual-mode modulator according to an embodiment.

FIG. 3 schematically illustrates a dual-mode modulator, DMM, 300 according to an embodiment. In the phase modulation path in FIG. 2, the DA 220 is employed to match the delay between the amplitude path and the phase path. Depending on the delay in the phase path and amplitude path for a practical implementation, the DA 220 can be moved to any position in either phase path or amplitude path, and be implemented in either digital or analog way. For the purpose of illustration of the DMM 300 in FIG. 3, it is assumed that the DA is provided in the phase path and provides delayed components Id and Qd to the DMM 300. The dual mode modulator maps the input signals Id and Qd into U and V by a matrix A in a mapping part 304, then the U and V signals are modulated by quadrature carrier clocks, and a radio frequency signal is created. The matrix A can be implemented in a look-up table, or RAM or ROM cells. In the first mode which is used for envelope tracking applications, the mapping part 304 just is a bypass having $$U=Id$$

$$V=Qd$$

In the second mode, the mapping part performs the following non-linear mapping:

$$U = \frac{Id}{\sqrt{Id^2 + Qd^2}}$$

$$V = \frac{Qd}{\sqrt{Id^2 + Qd^2}}$$

Thus, the U and V signal is amplitude normalized quadrature signals. After quadrature modulation, the output can be expressed as $$V_m = \begin{cases} A_m \sin(\omega t + \varphi_m) & \text{in first mode} \\ \sin(\omega t + \varphi_m) & \text{in second mode} \end{cases}$$

where $$A_m = \sqrt{Id^2 + Qd^2}$$

$$\varphi_m = \arctan\left[\frac{Qd}{Id}\right]$$

The above equations imply that in the first mode, the modulator performs a normal linear quadrature modulation, while in the second mode the modulator merges a normal linear quadrature modulation and limiter function together.

The limiter function can also be implemented in analog ways, and an exemplary circuit is shown in FIG. 3, where an analog limiter 302 and a multiplexer 306 are used.

Figure 4:
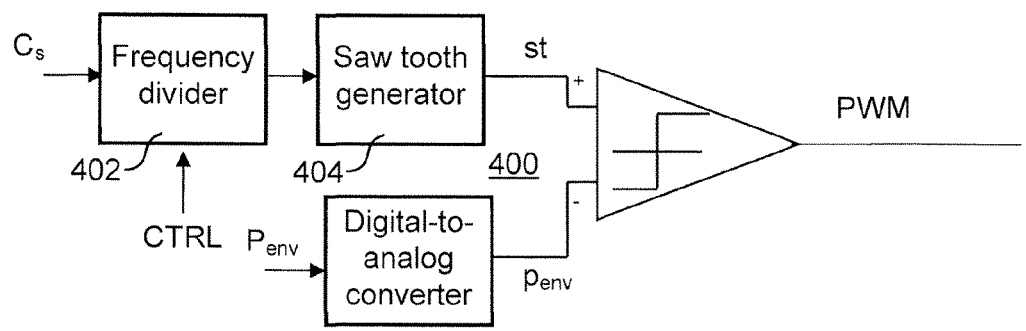
FIG. 4 schematically illustrates a pulse width modulation converter according to an embodiment.
Figure 5:
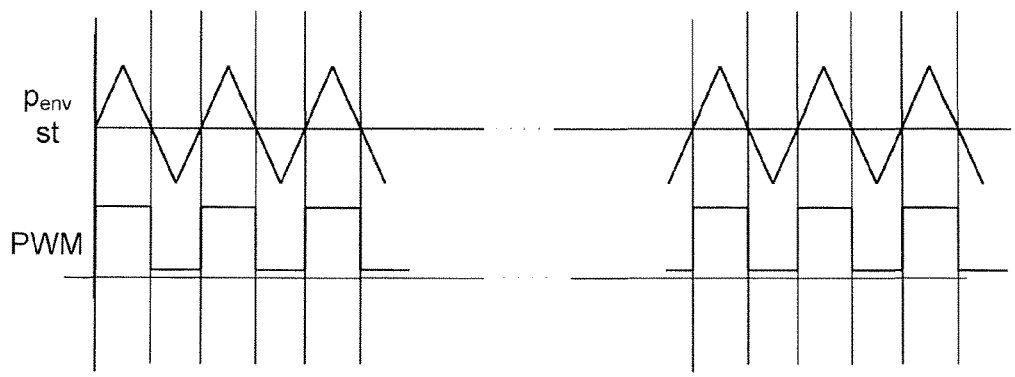
FIG. 5 illustrates operation of a pulse width modulation converter in wide band mode according to an embodiment.
Figure 6:
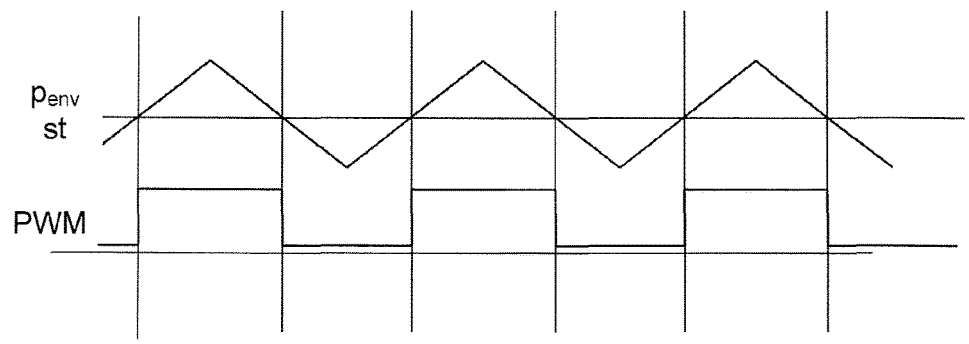
FIG. 6 illustrates operation of a pulse width modulation converter in narrow band mode according to an embodiment.

FIG. 4 schematically illustrates a pulse width modulation converter 400 according to an embodiment. Envelope/amplitude generator EAG 214 of FIG. 2 creates a digital envelope or polar modulation amplitude signal according to the quadrature digital input I and Q components. To create polar modulation, a one-to-one mapping is employed $$\text{Amp}(n) = \sqrt{i^2(n) + q^2(n)}$$

While for envelope signals, the generation may not be a unique, for example, the envelope signal can be created by $$Env(n) = G_0\left(\sqrt{i^2(n) + q^2(n)}\right) + \sum_{m=0}^{N-1} h(n-m)\sqrt{i^2(m) + q^2(m)}$$

Where h( ) is coefficients of a digital filter, and $G_0$( ) creates a voltage gap between the max amplitude and supply voltage to guarantee that the linear power amplifier always operates at linear region. Another example may be $$Env(n) = G_0(\sqrt{i^2(n) + q^2(n)}) + \max[\sqrt{i^2(n) + q^2(n)}]$$

Both envelope signals and amplitude signals can be over-sampled and smoothed in digital manners.

The output Po of the power amplifier is unfortunately a non-linear function of the envelope or amplitude signal, say Po=f(env) or Po=g(amp). In PDIS, signal envelope signal or amplitude signal is non-linearly mapped into Penv or Pamp by the pre-distortion function P and Q Penv=p(Env)

OR

Pamp=Q(Amp)

So that

Po=f(P(Env))=k·Env

Or

Po=g(Q(Amp))=k·Amp

Where P or Q is a reverse function of f(·) or G(·) that reduces the amplitude distortion in the amplitude path.

Through PWMC 400, the digital signal $P_{env}$ is converted into pulse width modulated pulse sequence PWM, where the pulse width is a function of the input voltage and the pulse frequency is C. There are many different ways for creating PWM. For example, the pulse width modulated sequence can be created by cutting a saw-tooth input, provided by a saw-tooth generator 404 with repeat frequency of $C_s$, as shown in FIG. 4, and the PWMC can have two modes, illustrated in FIGS. 5 and 6 for a wide band signal and a narrow band signal, respectively, controlled by CTRL which changes the divider ratio of a frequency divider 402.

The switching frequency of the PWM pulse sequence determines the conversion efficiency of the switch mode voltage converter, as regulator transistor in the switch mode voltage converter is operating at this frequency, and charges and discharges capacitance in the load and LPF, leading to a dynamic power consumption. The dynamic power reduces the conversion efficiency in switch mode voltage converter. According to the particular user scenario, the controller sets the divider ratio corresponding to the bandwidth which in turn optimizes the switch mode voltage converter conversion efficiency.

The DC/DC-converter switch mode voltage converter can also operate in two modes. One is used in narrow bandwidth applications where polar modulation is implemented, illustrated in FIG. 7, and another is for the linear mode, i.e. wide band mode, where envelope tracking is performed, shown in FIG. 8.

Figure 7:
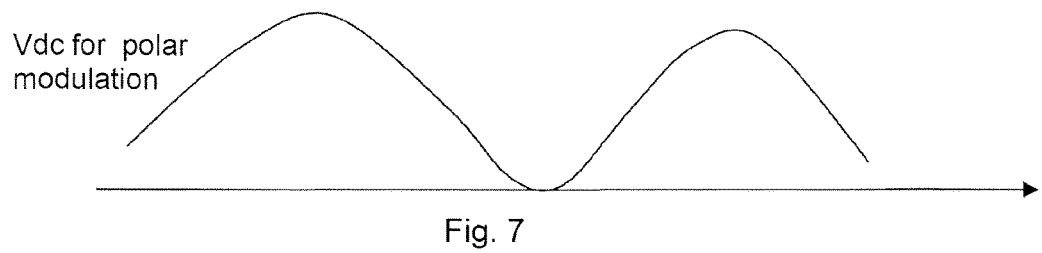
FIG. 7 illustrates supply voltage to power amplifier when operating in polar modulation mode.
Figure 8:
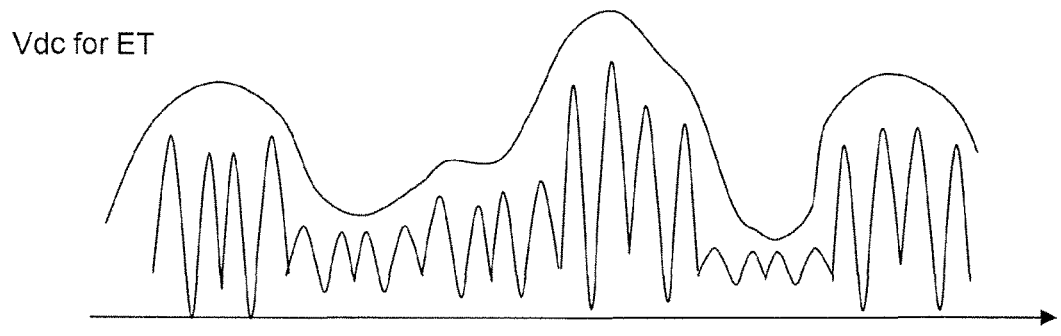
FIG. 8 illustrates supply voltage to power amplifier when operating in envelope tracking mode, and also illustrates a corresponding amplified signal.
Figure 9:
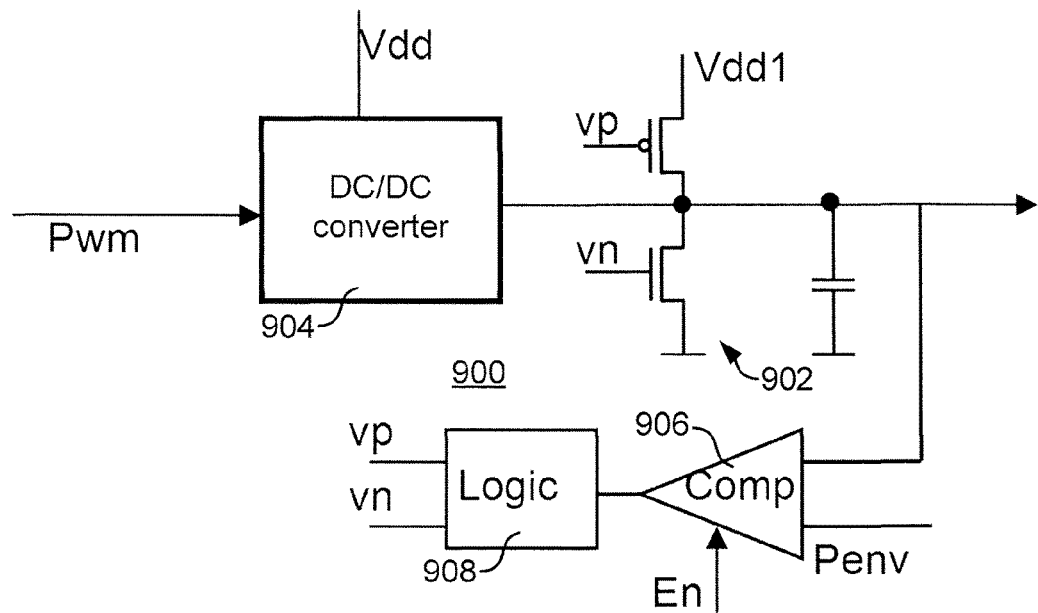
FIG. 9 schematically illustrates a switch mode voltage converter set-up according to an embodiment.

For the narrow bandwidth applications, the switch mode voltage converter has the similar structure like a normal DC/DC converter 904, and the slew rate of the output of the converter 904 is enough to follow the change of Penv as illustrated in FIG. 7. In wide bandwidth applications, an additional fast switch 902 and a fast comparator 906, as illustrated in FIG. 9, can automatically be turned on when bandwidth expansion happens. The output of the comparator 906 is provided to a logic circuitry 908 which in turn controls switches of the switch arrangement 902.

Figure 10:
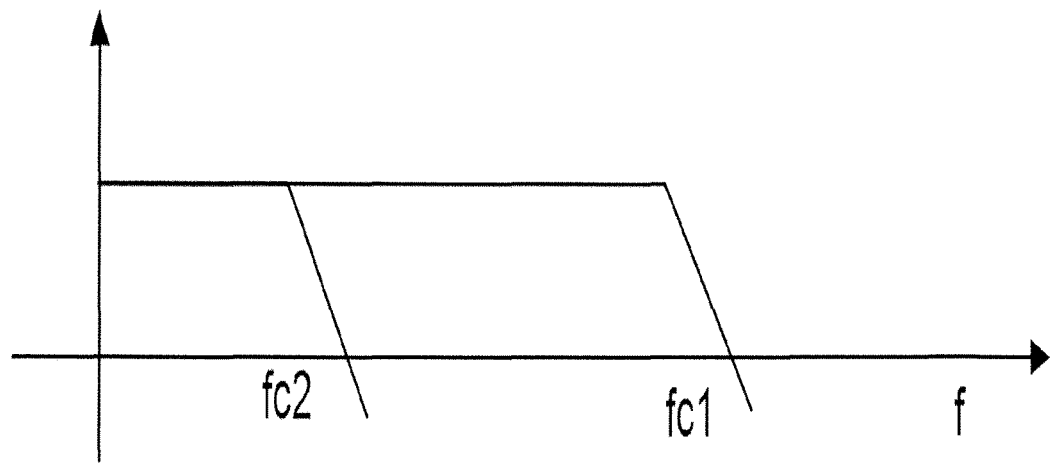
FIG. 10 schematically illustrates cut-off frequencies for a low-pass filter arranged to filter output from switch mode voltage converter in respective operation modes.

The LPF 208 of FIG. 2 can optionally be designed to have different cut-off frequencies, as illustrated in FIG. 10, and the LPF can comprise LC passive devices, MEMS or other semi-conductor switches with low insertion loss.

The DMPA has dual operating modes, i.e. the linear mode for working with envelope tracking and the non-linear mode for polar modulation, corresponding to the bandwidth requirement etc. for different applications. The operating mode can be changed by setting the operation point of the power amplifier. For example, a power amplifier can operate at class A, or AB for linear operation. To improve the power efficiency, the power amplifier can also be set to operate in non-linear mode, say class D or E, without substantively changing the topology of the amplifier, assuming that the output network can remove any unwanted harmonic components. Of course, it is also possible to have both linear power amplifier and non-linear power amplifier in parallel and each of them has an enable control, and only one of them is enabled during operation.

Figure 11:
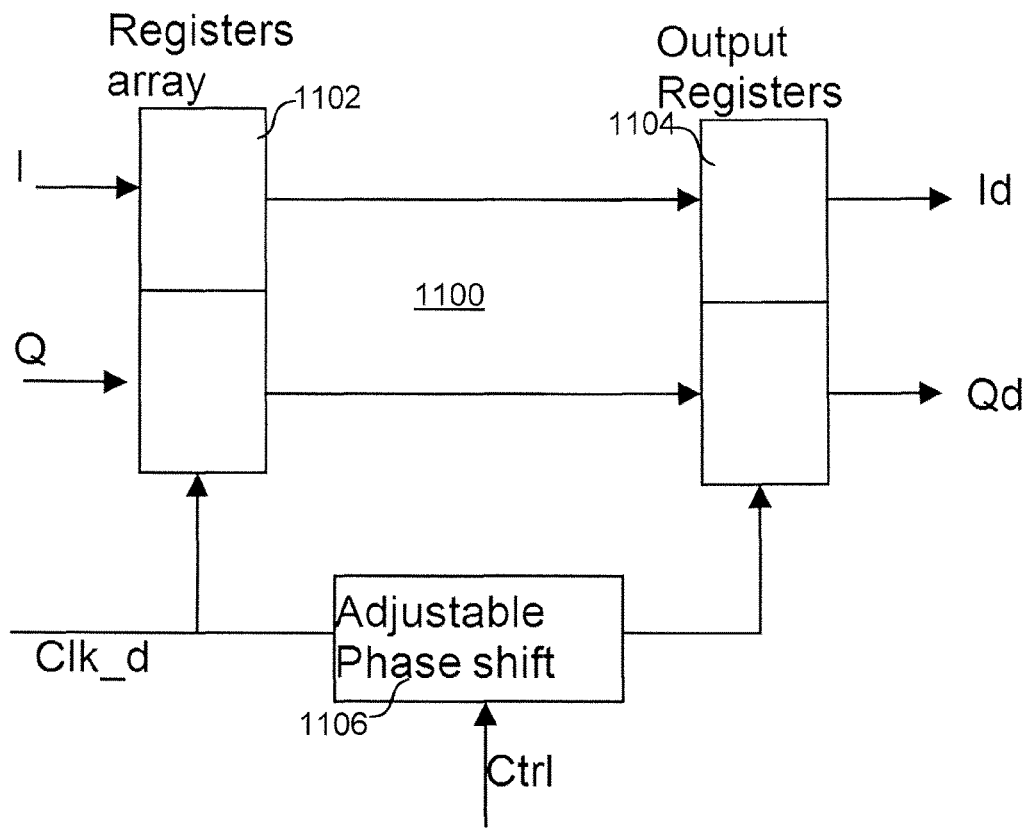
FIG. 11 schematically illustrates a delay adjustment mechanism arranged to match delay between amplitude path and phase path according to an embodiment.

FIG. 11 illustrates a DA 1100 according to an embodiment. The I and Q components are fed to a register array 1102 under control of a clock signal, and are output from output registers 1104 under control of an adjusted clock signal wherein the adjusted clock signal is provided by an adjustable phase shifter 1106 which preferably is controlled by the controller 206 of FIG. 2. Depending on the delay in the phase path and amplitude path for a practical implementation, the delay adjust unit can be moved to any position, either the phase path or amplitude path, and be implemented in either digital or analog manner.

FIG. 12 is a flow chart illustrating a method according to an embodiment. A transmitter is operated 1200 in a radio access technology, RAT, which for example can be GSM, EDGE, WCDMA or LTE. The allocated bandwidth for a transmission to be made is determined 1202. The determination can be made, for some RATs such as GSM, fairly simple because the RAT only supports bandwidths below a threshold where non-linear mode can be used. For other RATs, such as LTE, the allocated bandwidth can imply any of non-linear, which is preferred due to high efficiency, or linear operation. Thus, the mode of operation for power amplifier etc. according to what has been demonstrated above is determined 1204 such that the transmitter can adapt accordingly and perform the transmission. The procedure repeats itself all the time, and next transmission may be in another or the same RAT, with another allocated bandwidth, and the suitable mode of operation is selected for that transmission.

FIG. 13 is a flow chart illustrating a method according to an embodiment. A transmitter is operated 1300 in a RAT which for example can be GSM, EDGE, WCDMA or LTE. The allocated bandwidth for a transmission to be made is determined 1302. The determination can be made, for some RATs such as GSM, fairly simple because the RAT only supports bandwidths below a threshold where non-linear mode can be used. For other RATs, such as LTE, the allocated bandwidth can imply any of non-linear, which is preferred due to high efficiency, or linear operation. In the case of LTE, the allocated bandwidth will be known four subframes in advance from an uplink grant message. The allocated bandwidth is compared 1304 with a threshold.

If the allocated bandwidth exceeds the threshold, which for example can be 5 MHz, envelope tracking is applied 1305 and linear mode is selected 1307 for the power amplifier. Optionally, a higher cut-off frequency (compared to the one which will be applied for polar modulation) can be selected 1309 for a low-pass filter arranged at output of switch mode voltage converter.

If the allocated bandwidth does not exceed the threshold, polar modulation is applied 1306 and non-linear mode of operation is selected 1308 for the power amplifier. Optionally, a lower cut-off frequency (compared to the one which will be applied for envelope tracking) can be selected 1310 for a low-pass filter arranged at output of switch mode voltage converter.

Thus, the mode of operation for power amplifier etc. according to what has been demonstrated above is adapted such that the transmitter can perform the transmission as efficiently as possible. The procedure repeats itself all the time, and next transmission may be in another or the same RAT, with another allocated bandwidth, and the suitable mode of operation is selected for that transmission.

Figure 14:
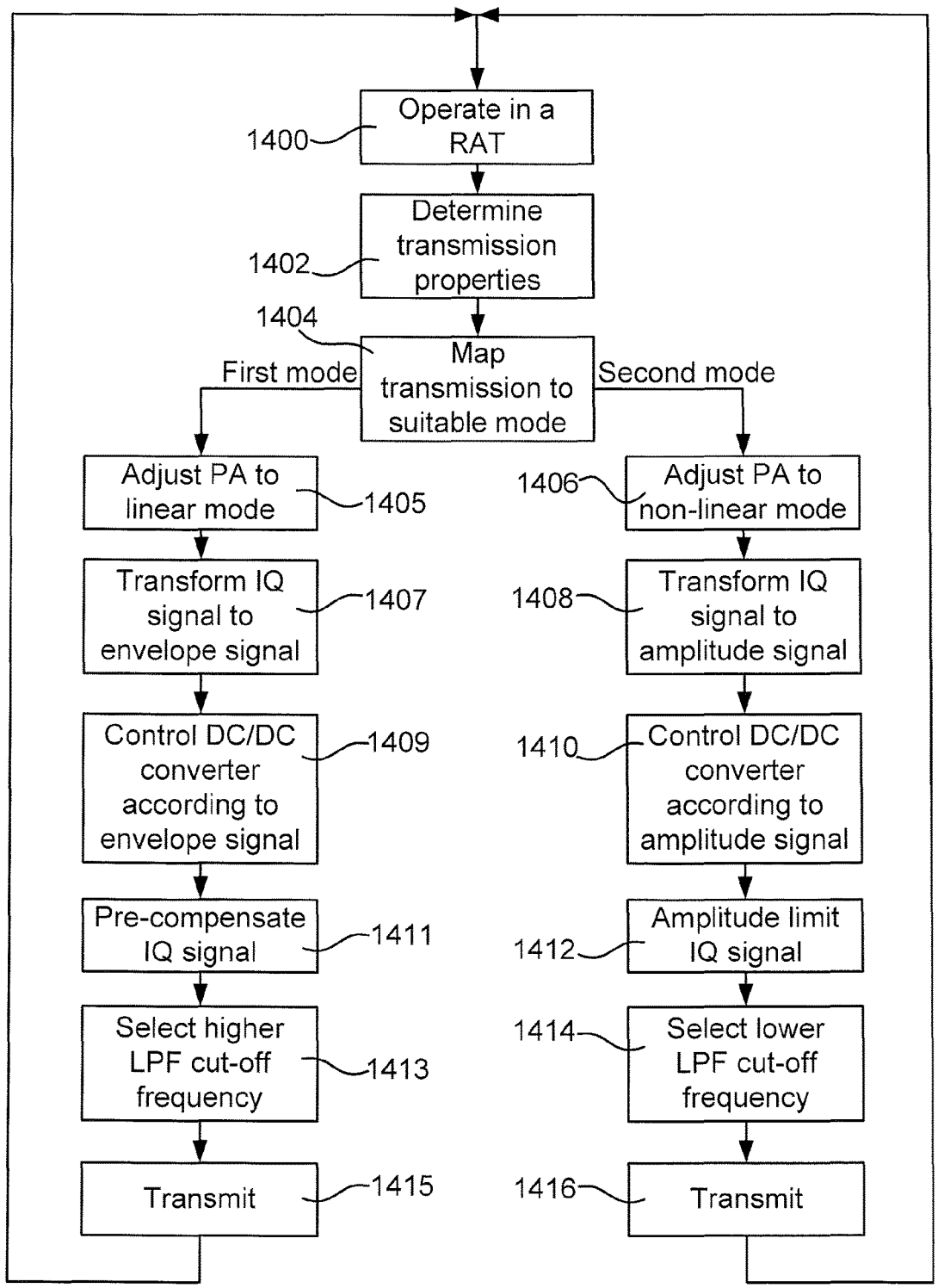
FIG. 14 is a flow chart illustrating a method according to an embodiment.

FIG. 14 is a flow chat illustrating a method according to an embodiment. A transmitter is operated 1400 in a RAT which for example can be GSM, EDGE, WCDMA or LTE. Transmission properties, such as modulation, output power, error vector magnitude and/or spectral leakage requirement, and the allocated bandwidth for a transmission to be made is determined 1402. The transmission properties are mapped 1404 to a suitable mode of operation. The mapping can include accessing a look-up table.

When the transmission properties are mapped to a first operation mode, the power amplifier is adjusted 1405 to linear mode of operation, the I and Q components provided from baseband are transformed 1407 into an envelope signal, and the switch mode voltage converter is controlled 1409 according to the envelope signal. Further, pre-compensation of the I and Q components can be made 1411, and/or selection of a higher cut-off frequency of a LPF as demonstrated above can be made 1413. The transmission is made 1415 according to the adaptations and with envelope tracked quadrature modulation as demonstrated above, and the procedure returns to take care of next transmission.

When the transmission properties are mapped to a second operation mode, the power amplifier is adjusted 1406 to non-linear mode of operation, the I and Q components are transformed 1408 to an amplitude signal, the switch mode voltage converter is controlled 1410 according to the amplitude signal, and the I and Q components are transformed 1412 to a phase signal, e.g. by being limited either digitally or by an analog limiter. Further, a lower cut-off frequency of the LPF can be made 1414. The transmission is made 1416 according to the adaptations and with polar modulation as demonstrated above, and the procedure returns to take care of next transmission.

The methods have been demonstrated with reference to FIGS. 12 to 14 as a few different examples. It should however be understood that some actions in one example can be substituted by corresponding other action from another example, e.g. the step on comparison with a bandwidth threshold can be substituted with mapping of transmission properties, or vice versa. Further, although the steps have been presented as a sequential order, this normally does not reflect the operation in reality. The elucidated adaptations are normally performed in parallel, or at least being performed as soon as necessary input data for the adaptation is available. As a few examples, the elements of the amplitude path are adapted simultaneously with the adaptations of the elements of the phase path, and the control of the switch mode voltage converter is performed during the whole transmission, the determination of transmission properties for the next transmission is normally started before the previous transmission is ready, etc.

The methods according to the present invention is suitable for implementation with aid of processing means, such as computers and/or processors, especially for example for the case where e suitable operation mode is to be determined on complex information and/or the signals provided to modulation in different operation modes are to be determined accordingly. Therefore, there is provided computer programs, comprising instructions arranged to cause the processing means, processor, or computer to perform the steps of any of the methods according to any of the embodiments described with reference to any of FIGS. 12-14. The computer programs preferably comprise program code which is stored on a computer readable medium 1500, as illustrated in FIG. 15, which can be loaded and executed by a processing means, processor, or computer 1502 to cause it to perform the methods, respectively, according to embodiments of the present invention, preferably as any of the embodiments described with reference to any of FIGS. 12-14. The computer 1502 and computer readable medium 1500 can be arranged to execute the program code sequentially where actions of the any of the methods are performed stepwise. The processing means, processor, or computer 1502 is preferably what normally is referred to as an embedded system. Thus, the depicted computer readable medium 1500 and computer 1502 in FIG. 15 should be construed to be for illustrative purposes only to provide understanding of the principle, and not to be construed as any direct illustration of the elements.

Figure 16:
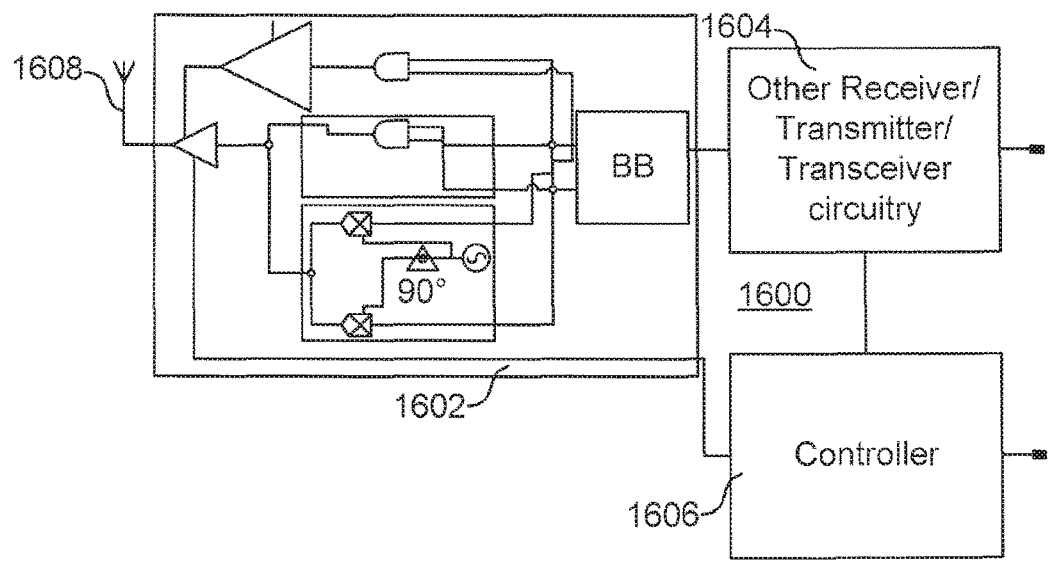
FIG. 16 schematically illustrates a radio circuit comprising a transmitter circuit according to embodiments.

FIG. 16 schematically illustrates a radio circuit 1600 according to an embodiment. The radio circuit 1600 comprises a transmitter circuit 1602 according to any of the embodiments demonstrated. The transmitter circuit provides its output signal to one or more antennas 1608, possibly via a feeding line and/or output network. The radio circuit 1600 can also comprise other radio circuitry 1604, which for example can comprise a receiver, signal processing device, interface circuit, etc. It is also possible that the radio circuit 1600 can comprise more than one transmitter circuit 1602, e.g. one being arranged to operate towards a cellular network and another arranged to operate towards a wireless access point. The radio circuit 1600 can also comprise a controller 1606, which for example can provide acquired data about coming transmission to the transmitter circuit 1602.

Figure 17:
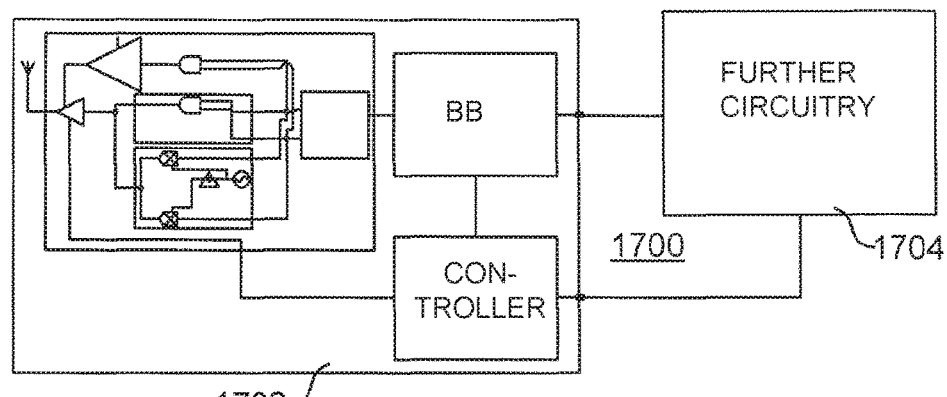
FIG. 17 schematically illustrates a communication device comprising a radio circuit according to embodiments.

FIG. 17 schematically illustrates a communication device 1700 according to an embodiment. The communication device comprises a radio circuit 1702 according to any of the embodiments demonstrated above. The communication device 1700 also comprises further circuitry and elements 1704 such as input and output devices, interfaces, power supply, etc. The radio circuit 1702 is connected to the further circuitry 1704 for provision or reception of signals that are received or to be transmitted. Further, the further circuitry and elements 1704 can provide control information to a controller of the radio circuitry 1702.

Figure 18:
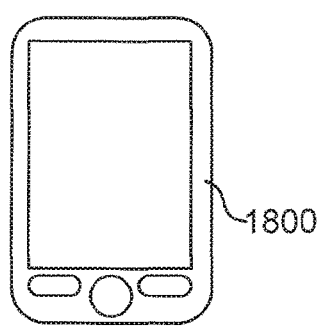
FIG. 18 illustrates a communication device according to an embodiment.

FIG. 18 schematically illustrates an example of a mobile communication device 1800 according to an embodiment. The mobile communication device can be arranged for communication in a cellular communication system and comprise the elements demonstrated above.

Figure 19:
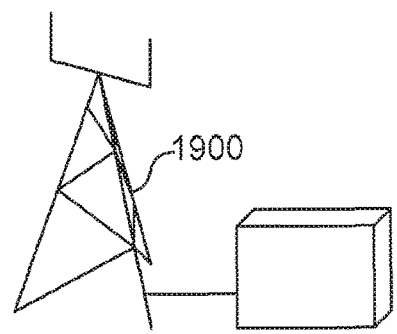
FIG. 19 illustrates a communication node according to an embodiment.

FIG. 19 schematically illustrates an example of a communication node 1900 according to an embodiment for operating a cell in a cellular communication system. The communication node 1900 can be arranged to operate a cell in a cellular communication system and comprise the elements demonstrated above.

Figure 20:
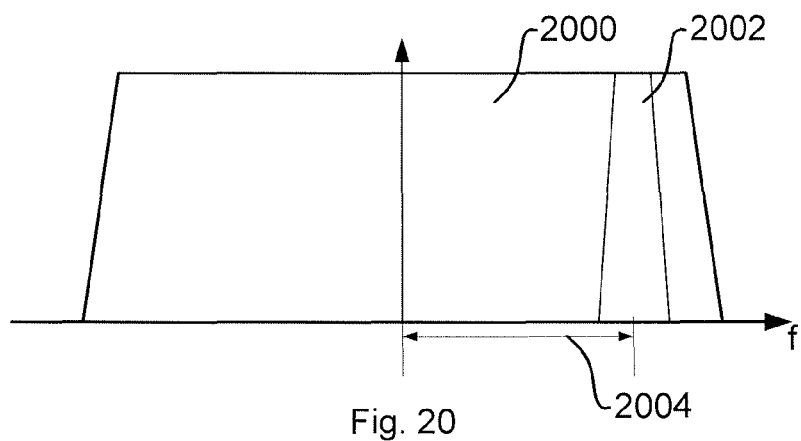
FIGS. 20 to 22 illustrate an example where a non-linear mode can be used.
Figure 21:
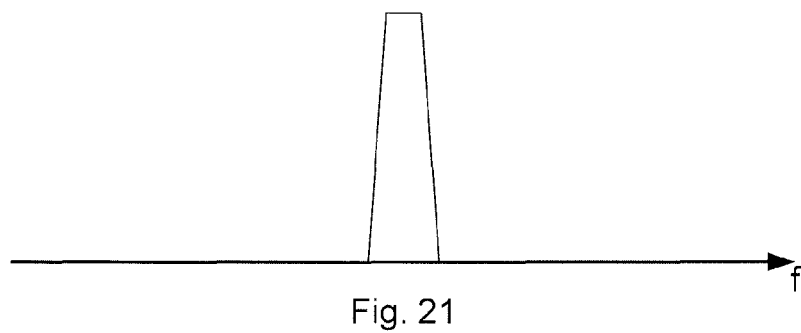
Figure 22:
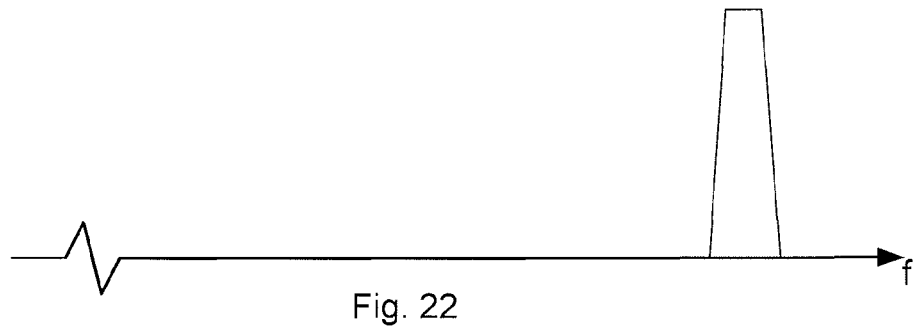

FIGS. 20 to 22 illustrate an example of a user scenario where polar modulation can be used. In FIG. 20, the LTE spectrum 2000 for the whole band in question is shown. The spectrum can be shared by a multitude of users. In FIG. 20, a user bandwidth 2002, i.e. allocated bandwidth, is also shown.

FIG. 21 shows a spectrum of the amplitude of the user occupied resource blocks. FIG. 22 shows phase modulated radio frequency clock signals. For such a user scenario in LTE uplink with whole spectrum 2000 when a user is scheduled to occupy a few gathered resource blocks with a frequency offset 2004 from a centre frequency of the spectrum 2000 and an allocated bandwidth 2002, an amplitude of a baseband signal will have a relatively narrow bandwidth compared to the bandwidth of the LTE spectrum 2000. Thus the transmitter is able to operate in the second operating mode and apply polar modulation. The phase modulation path will generate phase modulated radio frequency clock signals around the carrier frequency plus the offset frequency 2004, as illustrated in FIG. 22.

Figure 23:
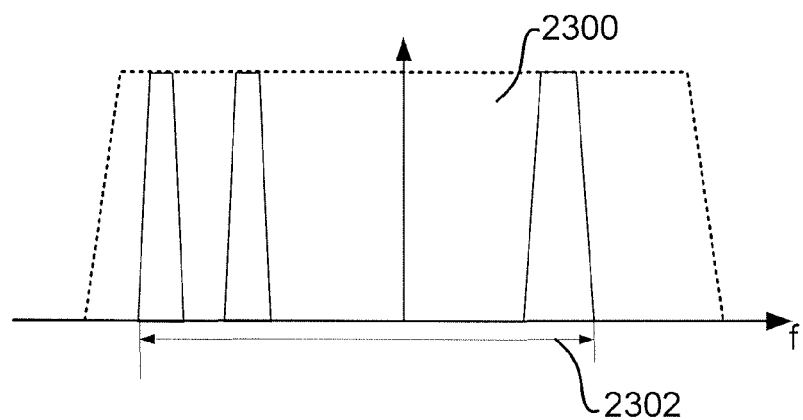
FIGS. 23 to 25 illustrate examples where linear mode needs to be used.
Figure 24:
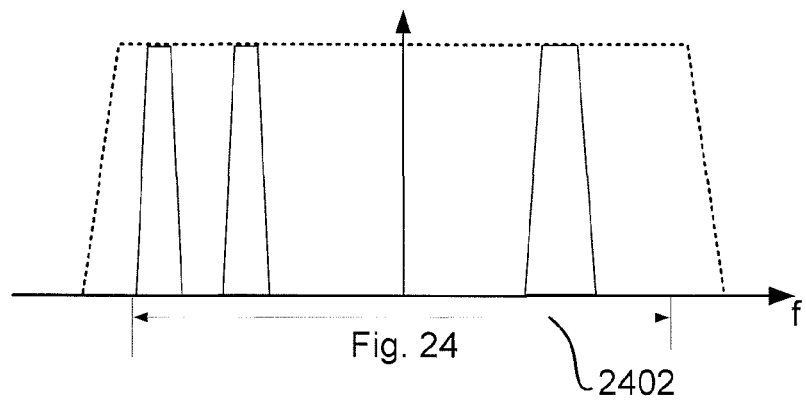
Figure 25:
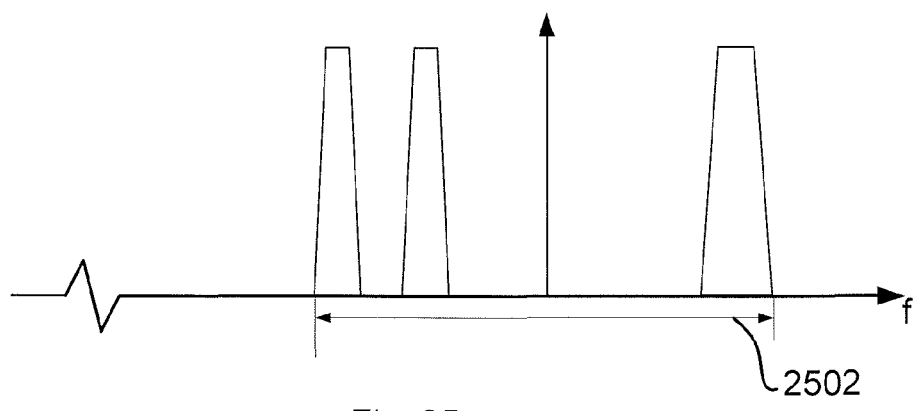

FIGS. 23 to 25 illustrate an example of a user scenario where envelope tracking need to be used. In FIG. 23, the LTE spectrum 2300 for the whole band in question is shown. The spectrum can be shared by a multitude of users. In FIG. 23, a user bandwidth 2302, i.e. allocated bandwidth, embracing allocated resource blocks distributed in different frequency locations is also shown. For such a user scenario in LTE uplink with whole spectrum 2300 when a user is scheduled to occupy resource blocks which are distributed over the spectrum 2300 and thus has an allocated bandwidth 2302 that is almost as wide as the bandwidth of the LTE spectrum 2300. In a first option, the transmitter can operate in the first operating mode preferably with envelope tracking using the carrier frequency of the centre frequency of the LTE spectrum with bandwidth 2402 shown in FIG. 24. In a second option, the modulator can generate quadrature modulated radio frequency clock signals with a frequency around the centre frequency of the LTE spectrum plus an offset frequency, as illustrated in FIG. 25, with bandwidth 2502 which is equal to 2302.

The invention has mainly been described above with reference to a few embodiments. However, as is readily appreciated by a person skilled in the art, other embodiments than the ones disclosed above are equally possible within the scope of the invention, as defined by the appended patent claims.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A communication device configured to operate in a 3GPP LTE cellular communication system, comprising:
   a power amplifier; and
   a switch mode voltage converter of direct current-to-direct current type arranged to provide a supply voltage to the power amplifier; wherein
   the power amplifier is configured to operate in a linear mode during uplink transmissions with a 20 MHz bandwidth, and in a nonlinear mode during uplink transmissions with a 5 MHz bandwidth.

2. The communication device of claim 1, wherein the linear mode is an envelope tracking mode.

3. The communication device of claim 1, wherein the nonlinear mode is a polar modulation mode.

4. The communication device of claim 3, wherein the switch mode voltage converter is configured to modulate the supply voltage of the power amplifier with an amplitude component of an uplink transmission, when operating in the polar modulation mode.

5. The communication device of claim 1, further comprising a controller configured to control the operating mode of the power amplifier.

* * * * *

UNITED STATES PATENT AND TRADEMARK OFFICE
CERTIFICATE OF CORRECTION

PATENT NO. : 10,033,561 B2
APPLICATION NO. : 15/625477
DATED : July 24, 2018
INVENTOR(S) : Mu et al.

Page 1 of 1

It is certified that error appears in the above-identified patent and that said Letters Patent is hereby corrected as shown below:

In the Specification

In Column 10, Line 17, delete "C." and insert -- Cs. --, therefor.

Signed and Sealed this
Nineteenth Day of February, 2019

Andrei Iancu
*Director of the United States Patent and Trademark Office*